(12) United States Patent
Huang et al.

(10) Patent No.: US 12,272,731 B2
(45) Date of Patent: Apr. 8, 2025

(54) MIDDLE-OF-LINE INTERCONNECT STRUCTURE AND MANUFACTURING METHOD

(71) Applicant: Taiwan Semiconductor Manufacturing Co., Ltd., Hsinchu (TW)

(72) Inventors: Yu-Lien Huang, Jhubei (TW); Ching-Feng Fu, Taichung (TW); Huan-Just Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 584 days.

(21) Appl. No.: 17/134,830

(22) Filed: Dec. 28, 2020

(65) Prior Publication Data

US 2022/0093757 A1    Mar. 24, 2022

Related U.S. Application Data

(60) Provisional application No. 63/081,423, filed on Sep. 22, 2020.

(51) Int. Cl.
*H01L 29/417* (2006.01)
*H01L 21/8234* (2006.01)
(Continued)

(52) U.S. Cl.
CPC ........... *H01L 29/41775* (2013.01); *H01L 21/823418* (2013.01); *H01L 21/823462* (2013.01); *H01L 21/823475* (2013.01); *H01L 27/088* (2013.01); *H01L 29/4236* (2013.01); *H01L 29/42364* (2013.01)

(58) Field of Classification Search
CPC ....... H01L 29/41775; H01L 21/823418; H01L 21/823462; H01L 21/823475; H01L 27/088; H01L 29/4236; H01L 29/42364; H01L 29/41783; H01L 29/78; H01L 29/6656; H01L 29/66545; H01L 21/76829;
(Continued)

(56) References Cited

U.S. PATENT DOCUMENTS 9,418,990 B2 *   8/2016   Azmat ................ H01L 27/0886
9,536,835 B2 *   1/2017   Song ............... H01L 21/823821
(Continued)

OTHER PUBLICATIONS

Non-Final Office Action dated Jun. 14, 2024 for U.S. Appl. No. 18/365,503.
(Continued)

*Primary Examiner* — Maliheh Malek
(74) *Attorney, Agent, or Firm* — Eschweiler & Potashnik, LLC

(57) ABSTRACT

In some embodiments, the present disclosure relates to an integrated circuit device. A transistor structure is disposed over a substrate and includes a pair of source/drain regions and a gate electrode between the pair of source/drain regions. A lower inter-layer dielectric (ILD) layer is disposed over the pair of source/drain regions and surrounds the gate electrode. The gate electrode is recessed from top of the lower ILD layer. A gate capping layer is disposed on the gate electrode. The gate capping layer has a top surface aligned or coplanar with that of the lower ILD layer.

20 Claims, 15 Drawing Sheets

(51) Int. Cl.
*H01L 27/088* (2006.01)
*H01L 29/423* (2006.01)

(58) Field of Classification Search
CPC ......... H01L 21/76831; H01L 21/76816; H01L 21/76834; H01L 21/823431
See application file for complete search history.

(56) References Cited

U.S. PATENT DOCUMENTS

| | | | |
|---|---|---|---|
| 9,666,533 B1* | 5/2017 | Basker | H01L 21/76897 |
| 9,825,031 B1* | 11/2017 | Bouche | H01L 29/41791 |
| 10,026,824 B1* | 7/2018 | Chanemougame | H01L 21/845 |
| 10,050,149 B1* | 8/2018 | Huang | H01L 21/823431 |
| 10,128,334 B1* | 11/2018 | Bourjot | H01L 29/78696 |
| 10,699,998 B2* | 6/2020 | Rastogi | H01L 23/5221 |
| 10,903,213 B2* | 1/2021 | Rastogi | H01L 21/76895 |
| 11,164,948 B2* | 11/2021 | Ho | H01L 29/0847 |
| 11,189,525 B2* | 11/2021 | Wang | H01L 23/485 |
| 11,462,471 B2* | 10/2022 | Chang | H01L 23/5226 |
| 11,482,456 B2* | 10/2022 | Shen | H01L 21/823475 |
| 11,621,352 B2* | 4/2023 | You | H01L 29/6656 257/288 |
| 11,652,149 B2* | 5/2023 | Chang | H01L 21/76825 257/750 |
| 11,942,372 B2* | 3/2024 | Huang | H01L 21/823437 |
| 11,978,779 B2* | 5/2024 | Kim | H01L 21/823475 |
| 12,002,869 B2* | 6/2024 | Xie | H01L 27/0886 |
| 2010/0327407 A1* | 12/2010 | Kang | H10B 12/482 257/532 |
| 2011/0183512 A1* | 7/2011 | Cho | H10B 12/315 257/E21.585 |
| 2011/0298017 A1* | 12/2011 | Jain | H01L 21/76897 257/288 |
| 2012/0273848 A1* | 11/2012 | Fan | H01L 21/823437 257/E21.409 |
| 2014/0077305 A1* | 3/2014 | Pethe | H01L 21/28008 257/E21.409 |
| 2014/0138794 A1* | 5/2014 | Yang | H01L 28/87 257/532 |
| 2014/0346575 A1* | 11/2014 | Chen | H01L 21/76816 438/666 |
| 2015/0126023 A1* | 5/2015 | Choi | H01L 29/512 438/591 |
| 2015/0155288 A1* | 6/2015 | Nakao | H01L 21/0217 257/532 |
| 2015/0243746 A1 | 8/2015 | Chiang et al. | |
| 2015/0311082 A1* | 10/2015 | Bouche | H01L 21/76895 257/288 |
| 2015/0340467 A1* | 11/2015 | Bouche | H01L 29/41791 438/283 |
| 2016/0005851 A1* | 1/2016 | Song | H01L 21/823475 257/401 |
| 2016/0099243 A1* | 4/2016 | Azmat | H01L 29/0649 257/368 |
| 2016/0372413 A1* | 12/2016 | Mahalingam | H01L 21/76832 |
| 2017/0092726 A1* | 3/2017 | Nidhi | H01L 29/66659 |
| 2017/0162503 A1* | 6/2017 | Olac-Vaw | H01L 29/42376 |
| 2017/0162581 A1 | 6/2017 | Lai et al. | |
| 2017/0186849 A1* | 6/2017 | Chen | H01L 21/76883 |
| 2017/0207312 A1* | 7/2017 | Jan | H01L 21/32136 |
| 2018/0308751 A1* | 10/2018 | Wang | H01L 21/76849 |
| 2018/0350662 A1* | 12/2018 | You | H01L 23/485 |
| 2019/0067436 A1* | 2/2019 | Wu | H01L 29/456 |
| 2019/0096677 A1* | 3/2019 | Xie | H01L 21/76897 |
| 2019/0131430 A1* | 5/2019 | Xie | H01L 21/76877 |
| 2019/0139825 A1 | 5/2019 | You et al. | |
| 2019/0164813 A1* | 5/2019 | Wang | H01L 29/0847 |
| 2019/0259855 A1* | 8/2019 | Cheng | H01L 21/28518 |
| 2019/0280088 A1* | 9/2019 | Xu | H01L 21/02532 |
| 2019/0288114 A1* | 9/2019 | Kim | H01L 29/0882 |
| 2019/0304900 A1* | 10/2019 | Chen | G06F 30/39 |
| 2019/0341309 A1* | 11/2019 | Basker | H01L 29/66795 |
| 2020/0006491 A1* | 1/2020 | Bomberger | H01L 21/02532 |
| 2020/0303261 A1* | 9/2020 | Shen | H01L 29/6656 |
| 2020/0381306 A1* | 12/2020 | Park | H01L 29/66795 |
| 2021/0043747 A1* | 2/2021 | Cheng | H01L 29/4983 |
| 2021/0057273 A1* | 2/2021 | Chen | H01L 23/53209 |
| 2021/0091191 A1* | 3/2021 | Ho | H01L 21/76802 |
| 2021/0098366 A1* | 4/2021 | Chang | H01L 21/28568 |
| 2021/0104612 A1* | 4/2021 | Bae | H01L 21/823821 |
| 2021/0202744 A1* | 7/2021 | You | H01L 21/823431 |
| 2021/0233847 A1* | 7/2021 | Kim | H01L 23/535 |
| 2021/0265202 A1* | 8/2021 | Wang | H01L 21/76804 |
| 2021/0305246 A1* | 9/2021 | Huang | H01L 29/66795 |
| 2021/0351123 A1* | 11/2021 | Bark | H01L 23/528 |
| 2021/0391432 A1* | 12/2021 | Yoo | H01L 21/76895 |
| 2022/0037338 A1* | 2/2022 | Wang | H01L 21/823475 |
| 2022/0068805 A1* | 3/2022 | Lee | H01L 29/7827 |
| 2022/0367348 A1* | 11/2022 | Chang | H01L 21/76849 |
| 2023/0036104 A1* | 2/2023 | Baek | H01L 21/02123 |
| 2023/0178623 A1* | 6/2023 | Li | H01L 21/823412 257/288 |
| 2023/0197802 A1* | 6/2023 | Chen | H01L 21/823821 257/401 |
| 2023/0238279 A1* | 7/2023 | Huang | H01L 29/66795 257/401 |
| 2023/0290842 A1* | 9/2023 | Chang | H01L 21/7684 |
| 2023/0377998 A1* | 11/2023 | Smith | H01L 21/823475 |
| 2023/0378027 A1* | 11/2023 | Choi | H01L 23/5286 |
| 2023/0395667 A1* | 12/2023 | Han | H01L 29/775 |
| 2024/0162095 A1* | 5/2024 | Huang | H01L 21/823475 |

OTHER PUBLICATIONS

Notice of Allowance dated Dec. 4, 2024, for U.S. Appl. No. 18/365,503.

* cited by examiner

MIDDLE-OF-LINE INTERCONNECT STRUCTURE AND MANUFACTURING METHOD

REFERENCE TO RELATED APPLICATION

This application claims the benefit of U.S. Provisional Application No. 63/081,423, filed on Sep. 22, 2020, the contents of which are hereby incorporated by reference in their entirety.

BACKGROUND

In the manufacturing of integrated circuits (ICs), devices are formed on a wafer and connected by conductive interconnect layers. These conductive interconnect layers can be formed during so-called middle-of-the-line (MOL) processes or back-end-of-line (BEOL) processes. MOL and BEOL processes are similar in that they both form openings in a dielectric layer (e.g. contact holes, trenches, or via holes in a dielectric layer), and then fill these openings with a conductive material. MOL differs from BEOL in that the MOL typically occurs earlier in the fabrication process, and may refer to the process of forming contacts directly on or close to device structures such as a gate electrode or a source/drain region; whereas BEOL typically occurs later in the fabrication process, and may refer to the process of forming successive metallization layers and vias above the contacts formed by MOL.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
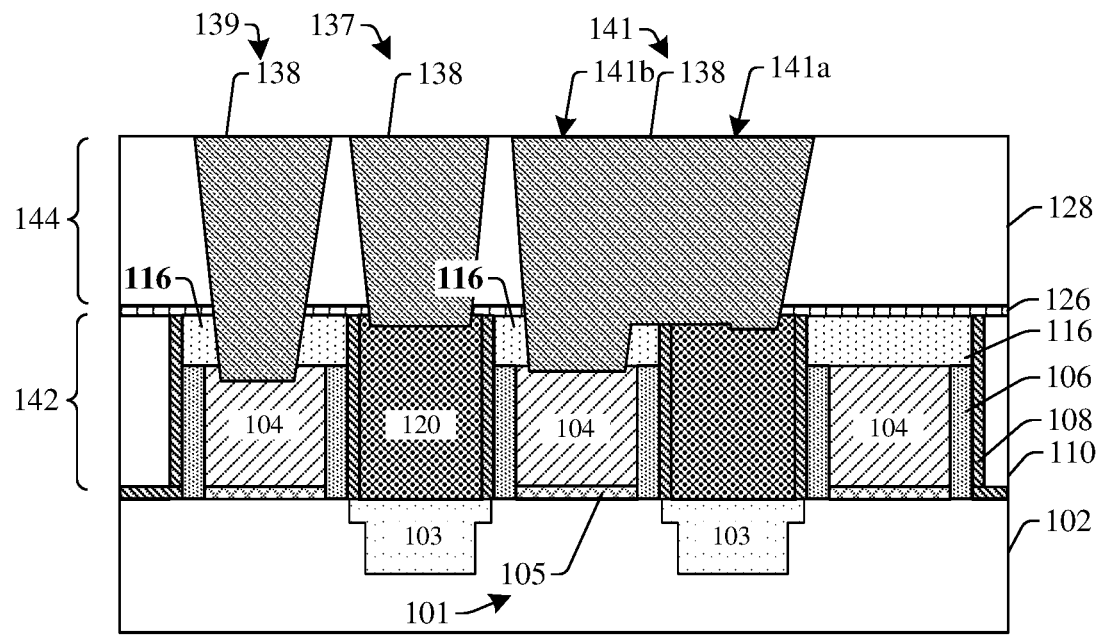
FIGS. 1A-1E illustrate various cross-sectional views of some additional embodiments of an integrated circuit device having a contact capping layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a middle-of-the-line (MOL) interconnect structure, both contacts and interconnect vias and metal lines play a significant role in transistor and circuit performance. As scaling continues, distances between various contacts and interconnect features shrink, and current leakage together with parasitic capacitance become key limiting factors for device performance. It is desired to reduce or prevent current leakage among contacts and other conductive features while at the same time to limit resistance and capacitance increase.

Accordingly, the present disclosure relates to an integrated circuit device with an improved MOL interconnect structure and associated manufacturing methods to protect contact, reduce contact resistance, and also improve parasitic capacitance. As a result, device reliability is improved, and manufacturing processes are simplified. In some embodiments, the integrated circuit device comprises a transistor structure disposed over a substrate and including a pair of source/drain regions disposed on a substrate and a gate electrode between the pair of source/drain regions. A lower inter-layer dielectric (ILD) layer is disposed over the pair of source/drain regions and surrounding the gate electrode. The gate electrode may be recessed from top of the lower ILD layer. A gate capping layer may be disposed on the recessed gate electrode and may have a top surface aligned or coplanar with that of the lower ILD layer. By recessing the gate electrode and implementing the gate capping layer, the gate electrode is isolated and protected from neighboring conductive features, and thus leakage issues can be reduced or eliminated. In some embodiments, the gate capping layer comprises an oxide material or a low-κ dielectric material, such that parasitic capacitance can be small. In some further embodiments, the integrated circuit device further comprises a lower source/drain contact disposed on a first source/drain region of the pair of source/drain regions. The lower source/drain contact may also be recessed from top. A source/drain capping layer may be disposed on the recessed lower source/drain contact to protect and isolate the lower source/drain contact from neighboring conductive features. Thus the leakage issue can be further reduced or eliminated. The source/drain capping layer comprises dielectric materials that may be same or different than the gate capping layer.

FIGS. 1A-1E show various cross-sectional views of an integrated circuit device in accordance with some embodiments. As shown in FIGS. 1A-1E, in some embodiments, a transistor structure 101 is disposed over a substrate 102. In various embodiments, the substrate 102 may be any type of semiconductor body (e.g., silicon, SiGe, SOI, etc.), such as a semiconductor wafer and/or one or more die on a wafer, as well as any other type of semiconductor layers, epitaxial layers, or dielectric layers associated therewith. The transistor structure 101 can be a logic device that includes a gate electrode 104 separated from the substrate 102 by a gate dielectric layer 105. A pair of source/drain regions 103 is disposed within the substrate 102 on opposite sides of the gate electrode 104. The transistor structure 101 can be a single-gate planar device as well as a multi-gate device, such as the FinFET device. The transistor structure 101 can also be other devices such as gate-all-around (GAA) devices, omega-gate devices, or pi-gate devices, as well as strained-semiconductor devices, silicon-on-insulator (SOI) devices, partially-depleted SOI (PD-SOI) devices, fully-depleted SOI (FD-SOI) devices, or other applicable devices.

Contacts are respectively coupled to the gate electrode 104, the source/drain regions 103, body contact regions, or other active regions of the transistor structure 101. In some embodiments, a contact may comprise a lower contact structure 142 surrounded by a lower inter-layer dielectric (ILD) layer 110 and/or to an upper contact structure 144 surrounded by an upper inter-layer dielectric (ILD) layer 128 and disposed over the lower ILD layer 110. The contact may comprise a metal core 138 and a barrier layer not shown in the figures. In some embodiments, the metal core 138 comprises or is made of tungsten, cobalt, ruthenium, titanium nitride, tantalum nitride, or other applicable metal. The barrier layer acts as a glue and barrier layer to bond the metal core to prevent the formation of voids and to prevent the metal core 138 from diffusing to the lower ILD layer 110 and/or the upper ILD layer 128. In some embodiments, the barrier layer has a thickness in a range of from about 2 nm to about 10 nm. A lower etch stop layer 108 may be disposed along and lining sidewalls of the lower ILD layer 110.

In some embodiments, an upper etch stop layer 126 may be disposed between the upper ILD layer 128 and the lower ILD layer 110. The lower etch stop layer 108 and the upper etch stop layer 126 may respectively comprise a dielectric material different from the lower ILD layer 110 and the upper ILD layer 128. For example, the lower etch stop layer 108 and the upper etch stop layer 126 may respectively comprise silicon nitride or silicon carbide and may have a thickness in a range of about 3 nm to 10 nm.

In some embodiments, the gate electrode 104 is recessed from the top of the lower ILD layer 110. A gate capping layer 116 is disposed on the gate electrode 104. The gate capping layer 116 may have a top surface aligned or coplanar with that of the lower ILD layer 110. For example, the recessed gate electrode 104 may have a thickness in a range of about 10 nm to 20 nm. The gate capping layer 116 may have a thickness in a range of about 20 nm to 40 nm. In some embodiments, the gate capping layer 116 comprises silicon dioxide or a low-κ dielectric material. Silicon dioxide has a dielectric constant of about 3.9 and the low-κ dielectric material has a dielectric constant smaller than 3. For example, the gate capping layer 116 may comprise carbon doped oxide dielectrics comprised of Si, C, O, and H (SiCOH), Low hydrogen content silicon oxycarbonitride (SiOCN), silicon oxycarbide (SiOC), or other applicable low-κ dielectric material. Comparing to using a semiconductor or dielectric material with a greater dielectric constant, such as silicon with a dielectric constant of about 11.7 or silicon nitride with a dielectric constant of about 7-8, a relative small dielectric constant of the gate capping layer 116 helps to reduce parasitic capacitance of the integrated circuit device.

In some embodiments, the lower contact structure 142 comprises a lower source/drain contact 120 disposed on a source/drain region of the pair of source/drain regions 103. In some embodiments, the lower source/drain contact 120 fills in a slot between and directly contacts sidewalls of the lower etch stop layer 108.

In some embodiments, the upper contact structure 144 comprises an upper source/drain contact 137 disposed through the upper ILD layer 128 reaching on a source/drain region of the pair of source/drain regions 103. In some alternative embodiments, the upper source/drain contact 137 may be disposed on the lower source/drain contact 120 and electrically coupled to a source/drain region of the pair of source/drain regions 103 through the lower source/drain contact 120. In some embodiments, the upper contact structure 144 further comprises a gate electrode contact 139 disposed next to the upper source/drain contact 137 and through the upper ILD layer 128. The gate electrode contact 139 may be disposed through the gate capping layer 116 and electrically coupled to the gate electrode 104. The gate electrode 104 may comprise a stack of metal layers including work function metals disposed on a core gate metal. The gate electrode contact 139 may comprise or is made of the same material of the upper source/drain contact 137. The upper contact structure 144 may also comprise a body contact 141 including a first portion 141a electrically coupled to one of the source/drain regions 103 via the lower source/drain contact 120 and a second portion 141b electrically coupled to the gate electrode 104. In some embodiments, the body contact 141 comprises or is made of the same material of the upper source/drain contact 137 and the gate electrode contact 139.

The upper contact structure 144 such as the upper source/drain contact 137, the gate electrode contact 139, and the body contact 141 may respectively be disposed on a recessed upper surface of underlying conductive features such as the gate electrode 104 and the lower source/drain contact 120 to improve landing and reduce contact resistance. The upper contact structure 144 may respectively have a lateral dimension close to that of the underlying conductive features to achieve small resistance. For example, a bottom lateral dimension of the upper source/drain contact 137 may be substantially equal to, for example, within about 3-5 nm greater or smaller than, a top lateral dimension of the lower source/drain contact 120. A bottom lateral dimension of the gate electrode contact 139 may be substantially equal to, for example, within about 3-5 nm greater or smaller than a top lateral dimension of the gate electrode 104. A tilt angle of the upper source/drain contact 137 and the gate electrode contact 139 may be around 86°-89° from a lateral surface of the integrated circuit device. As a result, in a limited space, the lower contact structure 142 and the upper contact structure 144 can be arranged effectively isolated while maximizing the lateral dimensions, such that leakage problem is prevented while resistance is minimized.

Figure 1B:
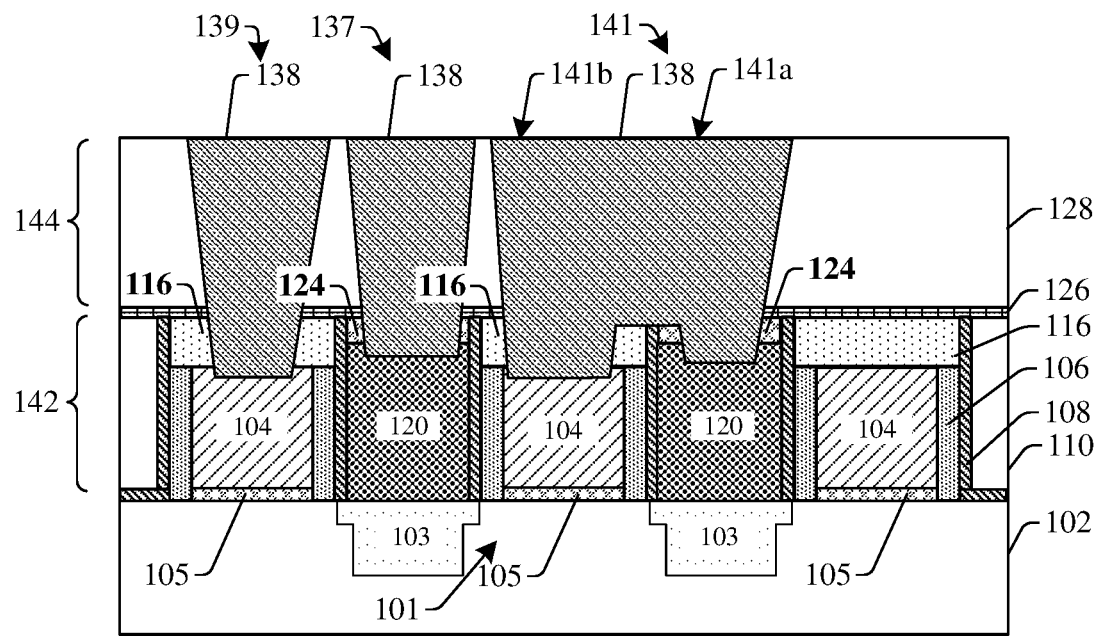
Figure 1C:
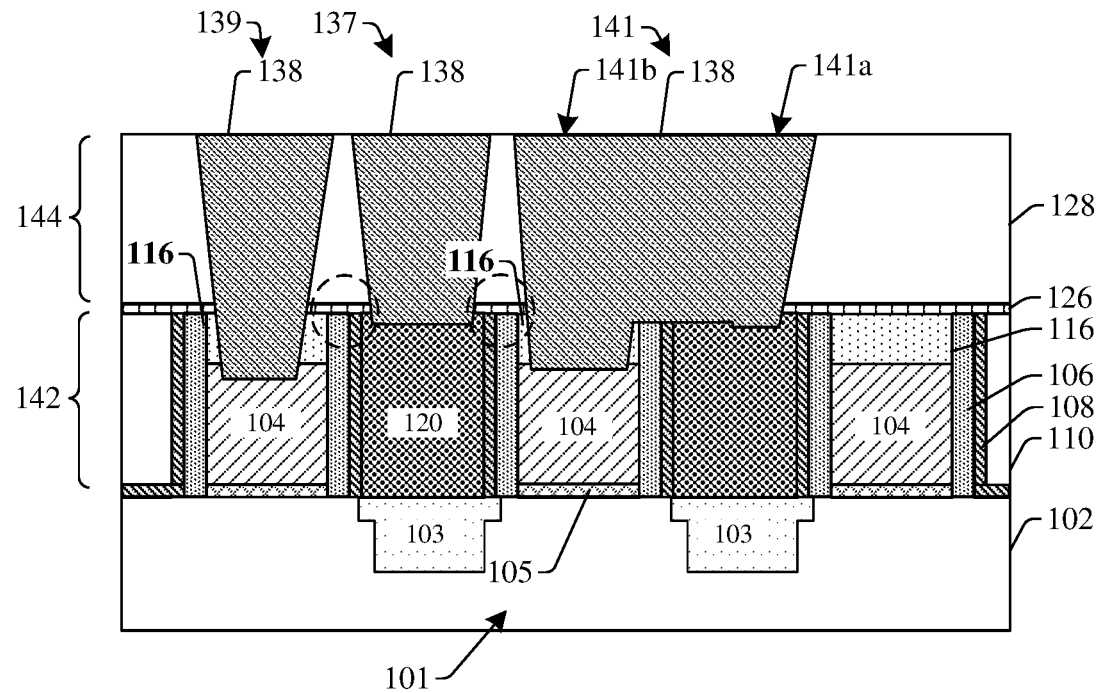

As shown in FIGS. 1A and 1C, in some embodiments, the lower source/drain contact 120 has a top surface aligned or coplanar with that of the lower etch stop layer 108. The upper etch stop layer 126 may be disposed directly on the gate capping layer 116 and the lower source/drain contact 120.

Figure 1D:
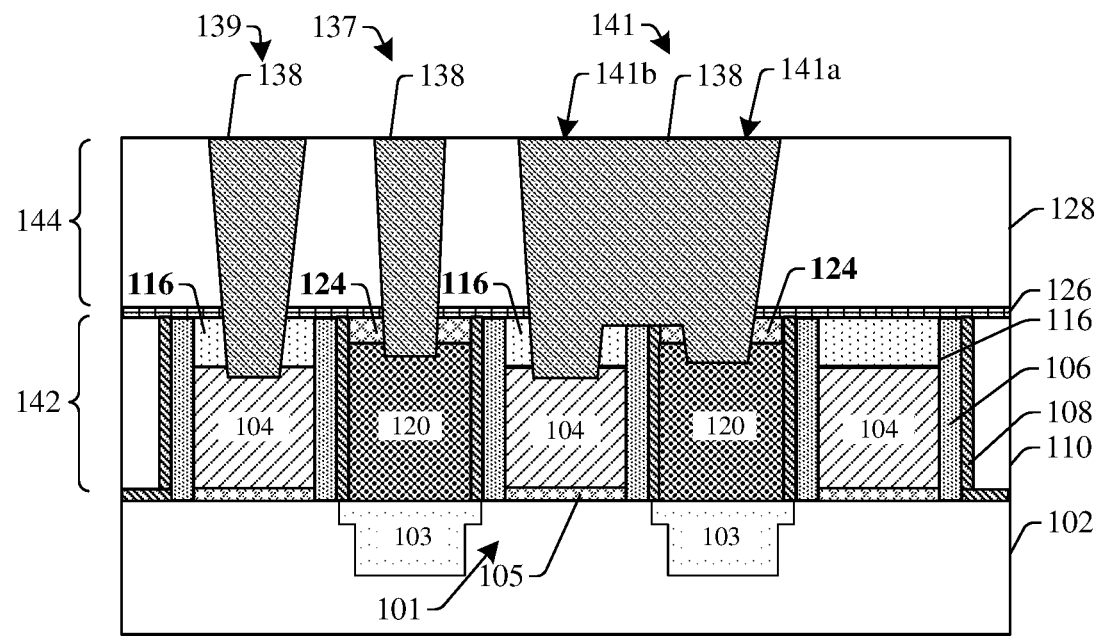
Figure 1E:
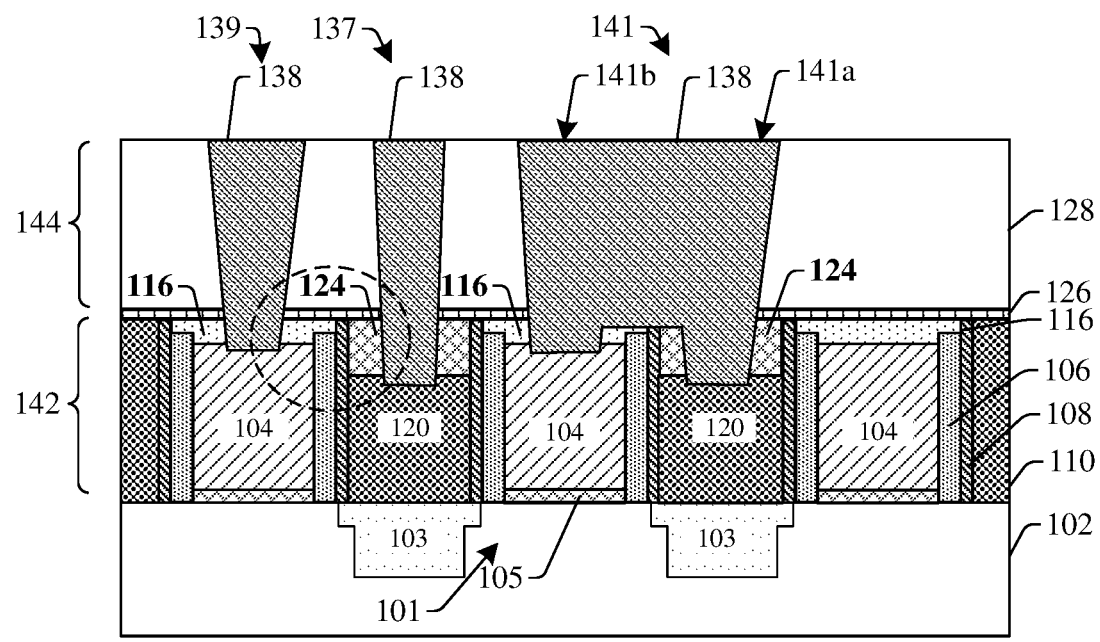

As shown in FIGS. 1B, 1D, and 1E, in some alternative embodiments, the lower source/drain contact 120 is recessed from the lower etch stop layer 108, and a source/drain capping layer 124 is disposed on the recessed lower source/drain contact 120. The source/drain capping layer 124 may have a top surface aligned or coplanar with that of the gate capping layer 116, and may be further aligned or coplanar with that of the lower etch stop layer 108. For example, the recessed lower source/drain contact 120 may have a thickness in a range of about 30 nm to 60 nm. The source/drain capping layer 124 may have a thickness in a range of about 5 nm to 25 nm. In some embodiments, the source/drain capping layer 124 may have a sidewall surface directly contacting the upper source/drain contact 137 and a bottom surface directly contacting the lower source/drain contact 120. As an example, the source/drain capping layer 124 may comprise or be made of silicon nitride, silicon carbide, the combination, or the like. In some embodiments, the source/drain capping layer 124 may have a thickness in a range of about 5 nm to about 25 nm. Heights of the recessed lower source/drain contact 120 and the recessed gate electrode 104 and the thicknesses of the gate capping layer 116 and the source/drain capping layer 124 may vary. For example, as shown in FIGS. 1B and 1D, the recessed lower source/drain contact 120 may be higher than the gate electrode 104, and the source/drain capping layer 124 is thinner than the gate capping layer 116. Alternatively, as shown in FIG. 1E, the recessed lower source/drain contact 120 may be lower than the gate electrode 104, and the source/drain capping layer 124 is thicker than the gate capping layer 116.

In some embodiments, the upper etch stop layer 126 is disposed over the gate capping layer 116 and the source/drain capping layer 124. A bottom surface of the upper etch stop layer 126 may contact the gate capping layer 116 and the source/drain capping layer 124. As an example, the upper etch stop layer 126 may comprise or be made of aluminum oxide, silicon nitride, or other applicable dielectric materials. In some embodiments, the upper ILD layer 128 may include or be made of materials such as PECVD oxide, FCVD oxide, tetraethylorthosilicate (TEOS) oxide, un-doped silicate glass, or doped silicon dioxide such as borophosphosilicate glass (BPSG), fused silica glass (FSG), phosphosilicate glass (PSG), boron doped silicon glass (BSG), and/or other suitable dielectric materials. In some cases, the upper ILD layer 128 may comprise a dielectric material the same as the lower ILD layer 110. In this instance, the upper etch stop layer 126 may comprise non-oxide dielectric materials such as silicon nitride. In some examples, the upper etch stop layer 126 has a thickness of about 3 nm to about 20 nm, and the upper ILD layer 128 has a thickness of about 5 nm to about 40 nm.

In some embodiments, a sidewall spacer 106 is disposed alongside the gate electrode 104. As shown in FIGS. 1A and 1B, the sidewall spacer may have a top surface aligned or coplanar with that of the gate electrode 104. The gate capping layer 116 may be disposed on both the gate electrode 104 and the sidewall spacer 106. Alternatively, the sidewall spacer 106 may have a top surface higher than that of the gate electrode 104. As shown in FIGS. 1C-1D, the top surface of the sidewall spacer 106 may be aligned or coplanar with that of the lower etch stop layer 108. The gate capping layer 116 may be disposed between upper portions of the sidewall spacer 106. As shown in FIG. 1E, the top surface of the sidewall spacer 106 may also be located between the top surfaces of the recessed gate electrode 104 and the lower etch stop layer 108. The gate capping layer 116 may be disposed between upper portions of the sidewall spacer 106 and extended over the top surfaces of the sidewall spacer 106.

Figure 2:
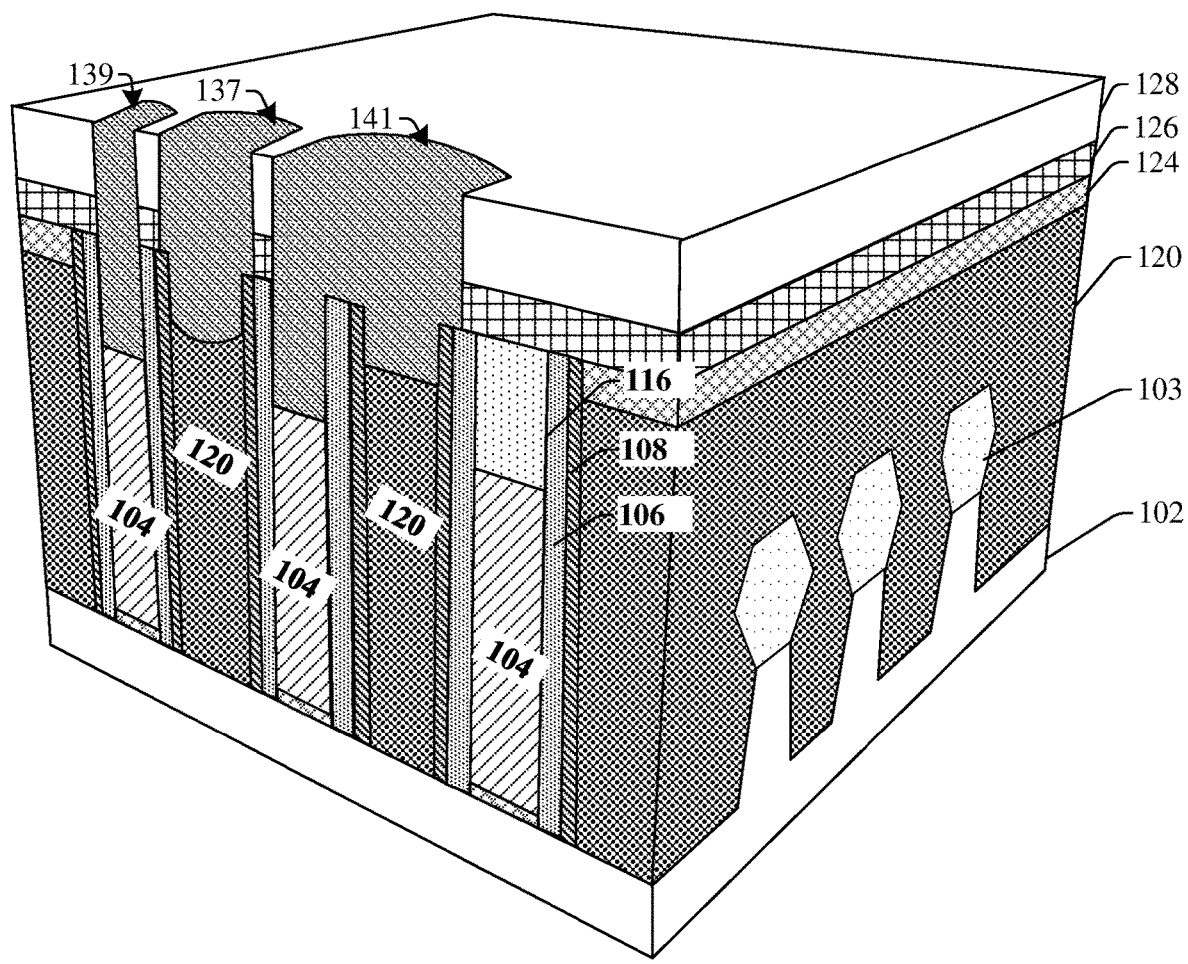
FIG. 2 illustrates a perspective view of some embodiments of an integrated circuit having a contact capping layer.

FIG. 2 illustrates a perspective view an integrated circuit device having a contact capping layer in accordance with some additional embodiments. In some embodiments, the integrated circuit device comprises FinFET devices, nanowire devices, or other gate-all-around (GAA) devices. The substrate 102 may comprise a lower base portion and a plurality of upper columns raised from the lower base portion, extended along a channel length direction, and arranged in parallel from one another. Epitaxial semiconductor layers may be disposed on the plurality of upper columns of the substrate 102 and may comprise high doped portions on opposite sides as the source/drain regions 103 and lightly doped or non-doped portions between the source/drain regions 103 as channel regions. A conductive layer may be disposed on the channel regions as the gate electrode 104 and separated from the channel regions by a gate dielectric and configured to control current flow of the channel regions. The gate electrode 104 may extend along a channel width direction perpendicular to the channel length direction. The gate electrode 104 may extend to wrap around sidewalls of the channel regions. As discussed associated with figures above, in some embodiments, the gate capping layer 116 is disposed on the gate electrode 104. The gate capping layer 116 may have a top surface aligned or coplanar with that of the lower etch stop layer 108. In some further embodiments, a source/drain capping layer 124 is disposed on the lower source/drain contact 120. The source/drain capping layer 124 may have a top surface aligned or coplanar with that of the lower etch stop layer 108. The upper source/drain contact 137 may be disposed through the upper ILD layer 128 and the source/drain capping layer 124 and reaching on the lower source/drain contact 120. The gate electrode contact 139 may be disposed through the upper ILD layer 128 and the gate capping layer 116 and reaching on the gate electrode 104. The body contact 141 may be disposed through both the gate capping layer 116 and the source/drain capping layer 124 and electrically coupling the gate electrode 104 and the lower source/drain contact 120.

Figure 3A:
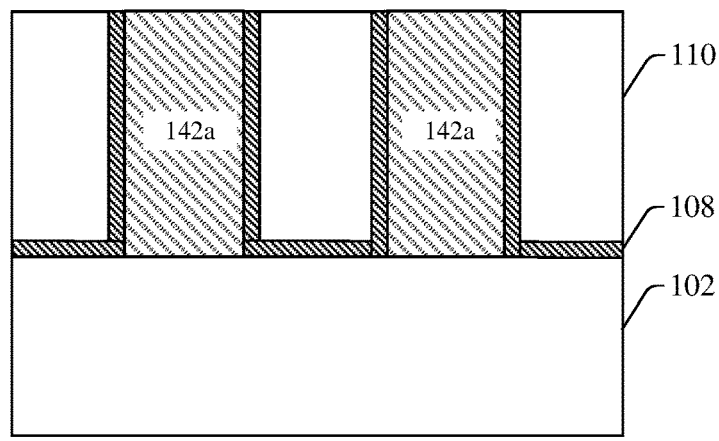
FIGS. 3A-3G illustrate a series of cross-sectional views and a flow diagram of some embodiments of a method of forming an integrated circuit device having a contact capping layer.

FIGS. 3A-3G illustrate a series of cross-sectional views and a flow diagram of some embodiments of a method of forming an integrated circuit device having a contact capping layer. As shown in FIG. 3A and act 152 of FIG. 3G, in some embodiments, a first lower contact structure 142a is formed over the substrate 102. The first lower contact structure 142a can be a device feature or a MOL contact feature such as the gate electrode 104 or the lower source/drain contact 120 shown by above figures. The lower etch stop layer 108 and the lower ILD layer 110 may be formed lining upper surfaces of the substrate 102 and sidewalls of the first lower contact structure 142a prior to or after the formation of the first lower contact structure 142a.

Figure 3B:
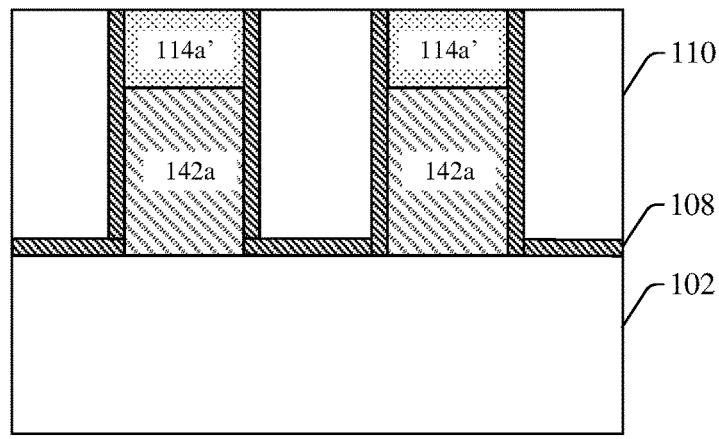
Figure 3C:
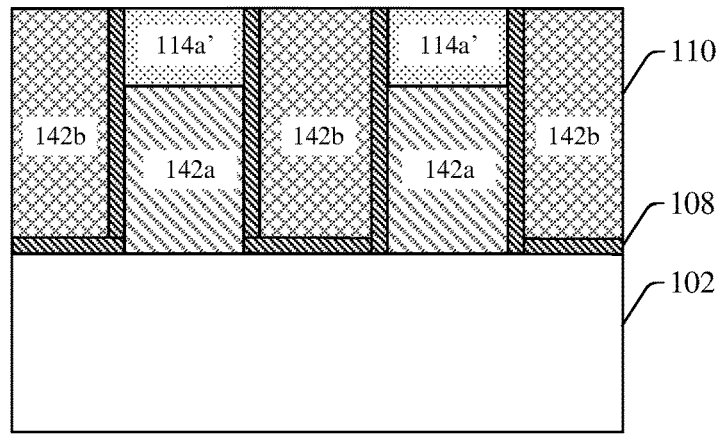
Figure 3D:
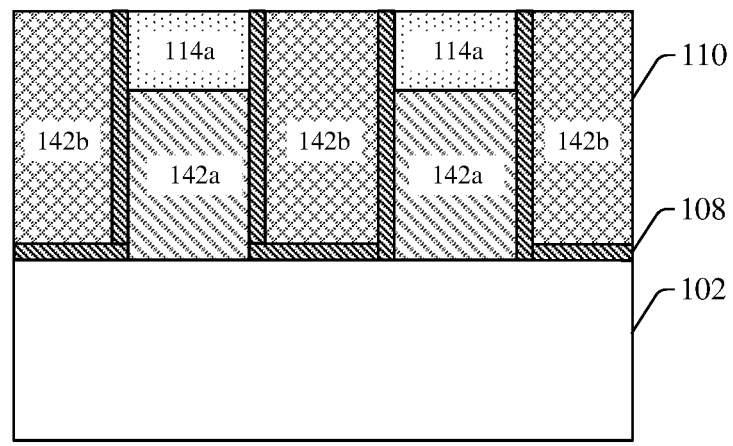
Figure 3E:
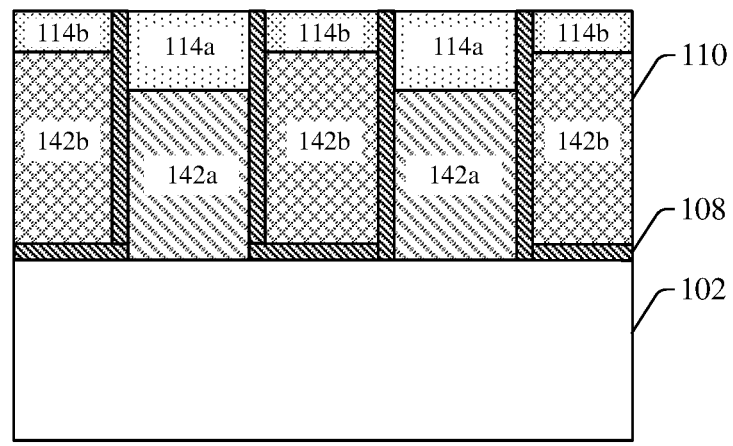
Figure 3F:
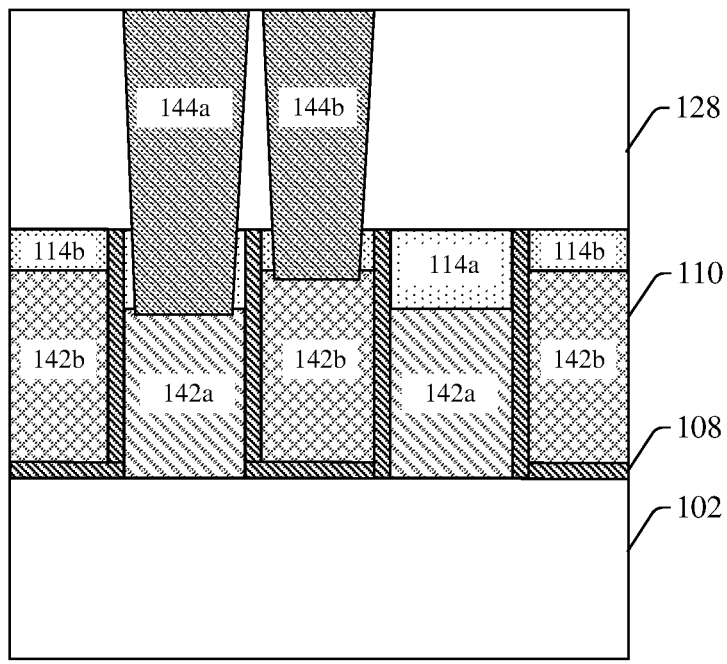
Figure 3G:
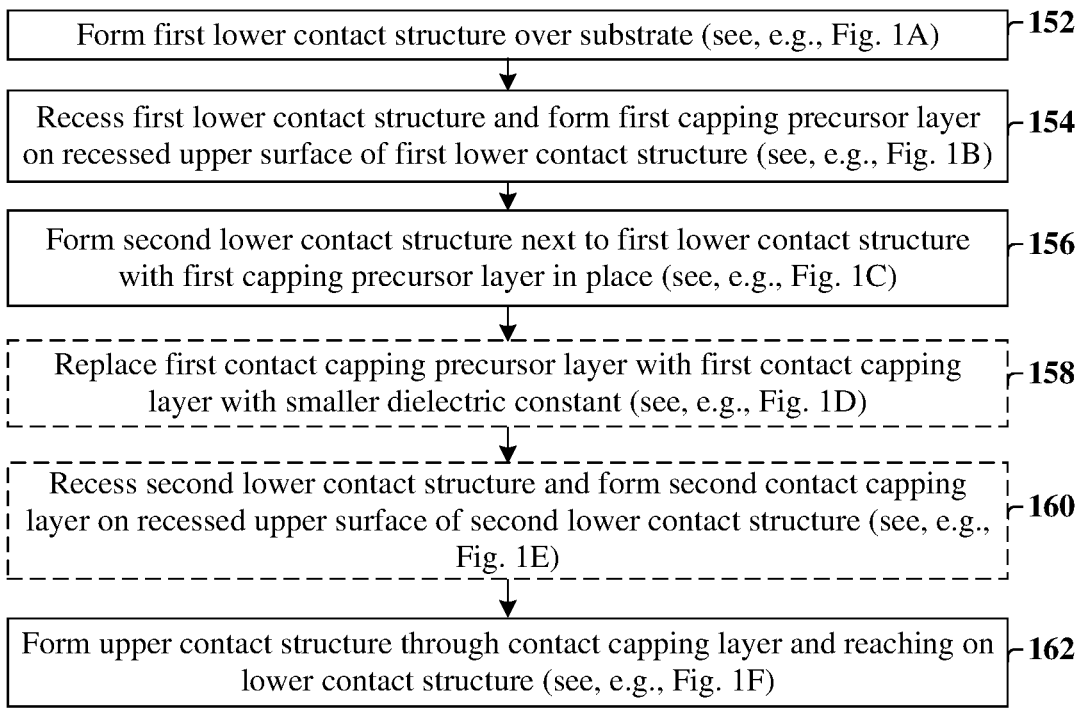

As shown in FIG. 3B and act 154 of FIG. 3G, in some embodiments, the gate electrode 142a is recessed. Then, a first contact capping precursor layer 114a' is formed on a recessed upper surface of the gate electrode 142a. The gate electrode capping precursor layer 114a' may comprise a semiconductor or dielectric material that is different from the lower ILD layer 110. The gate electrode capping precursor layer 114a' may be formed by a chemical vapor deposition process (CVD) or atomic layer deposition (ALD) process.

As shown in FIG. 3C and act 156 of FIG. 3G, in some embodiments, a second lower contact structure 142b is formed next to gate electrode 142a with the gate electrode capping precursor layer 114a' in place. In some embodiments, the lower ILD layer 110 and a lateral portion of the lower etch stop layer 108 under the lower ILD layer 110 are partially or completely removed to form an opening with the first contact capping precursor layer 114a' as a masking and protective layer. The lower ILD layer 110 may be removed by an etching processes that is selective to the lower ILD layer 110 than the lower etch stop layer 108 and the first contact capping precursor layer 114a'. The first contact capping precursor layer 114a' protects the first lower contact structure 142a from exposing during the removal of the lower ILD layer 110. Then, the second lower contact structure 142b is filled in the opening between vertical portions of the lower etch stop layer 108. The second lower contact structure 142b can be a MOL contact feature or a device feature such as the lower source/drain contact 120 or the gate electrode 104 of above figures.

As shown in FIG. 3D and act 158 of FIG. 3G, in some embodiments, the first contact capping precursor layer 114a' is replaced with a first contact capping layer 114a with a dielectric constant smaller than that of the first contact capping precursor layer 114a'. As an example, the first contact capping layer 114a may comprise or be made of low-κ dielectric material with a dielectric constant smaller than 3.9. Thereby, parasitic capacitance related to the first contact capping layer 114a can be reduced compared to using the first contact capping precursor layer 114a'.

As shown in FIG. 3E and act 160 of FIG. 3G, alternative to the embodiments that the second lower contact structure 142b having a top surface aligned or coplanar with that of the lower etch stop layer 108, in some other embodiments, the second lower contact structure 142b is recessed below the top of the lower etch stop layer 108. Then, a second contact capping layer 114b is formed on a recessed upper surface of second lower contact structure 142b. The second contact capping layer 114b protects the underlying second lower contact structure 142b during subsequent manufacturing steps such as preventing current leakage caused by the formation of an upper contact structure landing on the second lower contact structure 142b. As an example, the second contact capping layer 114b may comprise or be made of silicon nitride, silicon carbide, the combination, or the like. In some alternative embodiments, the second contact capping layer 114b may be replaced with a dielectric material with a smaller dielectric constant such as a low-κ dielectric material with a dielectric constant smaller than 3. Thereby, parasitic capacitance related to the second contact capping layer 114b can be reduced.

As shown in FIG. 3F and act 162 of FIG. 3G, in some embodiments, a first upper contact structure 144a may be formed through the first contact capping layer 114a and reaching on the first lower contact structure 142a. A second upper contact structure 144b may be formed through the second contact capping layer 114b and reaching on the second lower contact structure 142b.

FIGS. 4-17 illustrate cross-sectional views 400-1700 of some embodiments of a method of forming an integrated circuit having a contact capping layer. Although FIGS. 4-17 are described in relation to a method, it will be appreciated that the structures disclosed in FIGS. 4-17 are not limited to such a method, but instead may stand alone as structures independent of the method.

Figure 4:
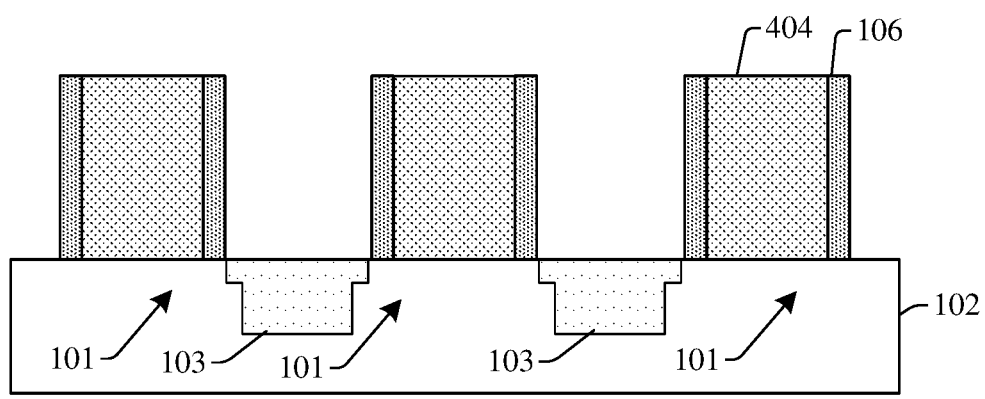
FIGS. 4-17 illustrate cross-sectional views of some embodiments of a method of forming an integrated circuit having a contact capping layer.
Figure 5:
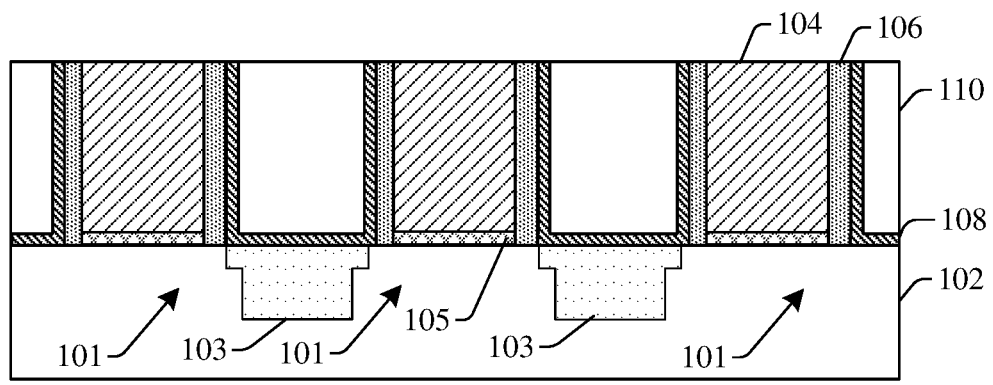

As shown in FIG. 4 and FIG. 5, a transistor structures 101 is prepared over a substrate 102 and surrounded by a lower ILD layer 110. The transistor structures 101 has a gate dielectric layer 105 over the substrate 102, a gate electrode 104 over the gate dielectric layer 105, and a pair of source/drain regions 103 within the substrate 102 disposed on opposite sides of the gate electrode 104 (see FIG. 5). The gate electrode 104 may be a polysilicon gate or a metal gate. The gate dielectric layer 105 may comprise or be made of a silicon dioxide layer or a high-κ dielectric material with a dielectric constant greater than 7 such as hafnium dioxide.

In some embodiments, the transistor structure 101 may be formed by a replacement gate process. As shown in FIG. 4, a dummy gate 404 is firstly formed and patterned over the substrate 102. A sidewall spacer 106 is formed alongside the dummy gate 404 lining or covering sidewalls of the dummy gate 404. A pair of source/drain regions 103 is formed on opposite sides of the sidewall spacer 106 within the substrate 102. In various embodiments, the sidewall spacer 106 comprises silicon dioxide, silicon nitride, silicon carbide, aluminum oxide, aluminum nitride, the combinations thereof, or other suitable dielectric materials. In some embodiments, the sidewall spacer 106 may comprise multiple layers, such as main spacer walls, liner layers, and the like. As an example, the sidewall spacer 106 may be formed by depositing a dielectric material over the dummy gate 404 and vertically etching back the dielectric material to have a top surface substantially coplanar with that of the dummy gate 404.

As shown in FIG. 5, a dielectric layer is deposited over the transistor structures 101 followed by a planarization process to form the lower ILD layer 110. In some embodiments, a lower etch stop layer 108 is formed lining upper surfaces of the substrate and extending upwardly along the sidewall spacer 106 prior to forming the lower ILD layer 110. The lower etch stop layer 108 may be formed by a deposition process such as an atomic layer deposition process (ALD) or a chemical vapor deposition process (CVD). The lower ILD layer 110 may be deposited by a subatmospheric CVD (SACVD) process, a flowable CVD process, or other suitable deposition technique. The lower etch stop layer 108 and the dielectric layer may be planarized by a chemical mechanical planarization (CMP) process to have a top surface substantially coplanar with that of the sidewall spacer 106. As an example, the dielectric layer to form the lower ILD layer 110 may include materials such as tetra-ethyl-orthosilicate (TEOS) oxide, un-doped silicate glass, or doped silicon dioxide such as borophosphosilicate glass (BPSG), fused silica glass (FSG), phosphosilicate glass (PSG), boron doped silicon glass (BSG), and/or other suitable dielectric materials. As an example, the lower ILD layer 110 has a thickness of about 40 nm to about 80 nm.

For the replacement gate process, the dummy gate 404 in FIG. 4 may be removed and replaced by the gate electrode 104 made of metal. The gate dielectric layer 105 may also be formed after removing the dummy gate 404. To form the gate electrode 104, stacks of metal materials may be filled in gate openings followed by a planarization process to remove excessive portions above the lower ILD layer 110. Varied for different devices, the stacks of metal materials may comprise or be made of titanium nitride, tantalum nitride, titanium aluminum, and aluminum, etc. Other materials can also be used for the gate electrode 104.

Figure 6:
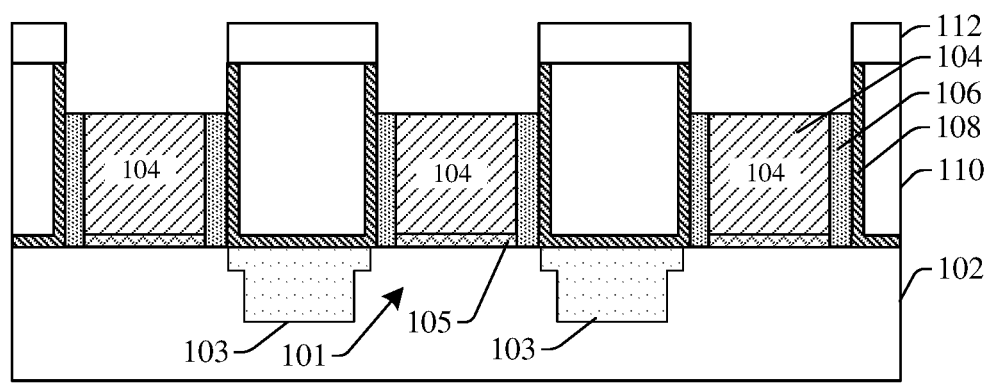

As shown in FIG. 6, in some embodiments, the gate electrode 104 is recessed. As an example, a patterning process is firstly performed to form a masking layer 112 over the lower ILD layer 110, leaving the gate electrode exposed. Then, an etching process is performed to the gate electrode 104 to lower a top surface of the gate electrode 104 to a position lower than a top surface of the lower ILD layer. Alternatively, the etching process is highly selective to the gate electrode 104 and a masking layer is not needed. In some embodiments, the etching process comprises an anisotropic etch such as a vertical dry etch, and the recessed top surface of the gate electrode 104 is substantially planar as shown in the figures. In some alternative embodiments, the etching process comprises an isotropic etch such as a wet etch, and the recessed top surface of the gate electrode 104 can be a concave shape though not shown in the figures. In some embodiments, the sidewall spacer 106 may be lowered together with the gate electrode 104. Depending on selectivity of etchants, the sidewall spacer 106 may be altered with a top surface lower, equal or higher than that of the gate electrode 104, as shown in FIGS. 1A-1E, for example. The gate electrode recessing process may expose an upper sidewall of the lower etch stop layer 108. The etching process controls a thickness of the gate electrode 104 and thus tunes an effective work function of the gate electrode 104 to a desired value.

Figure 7:
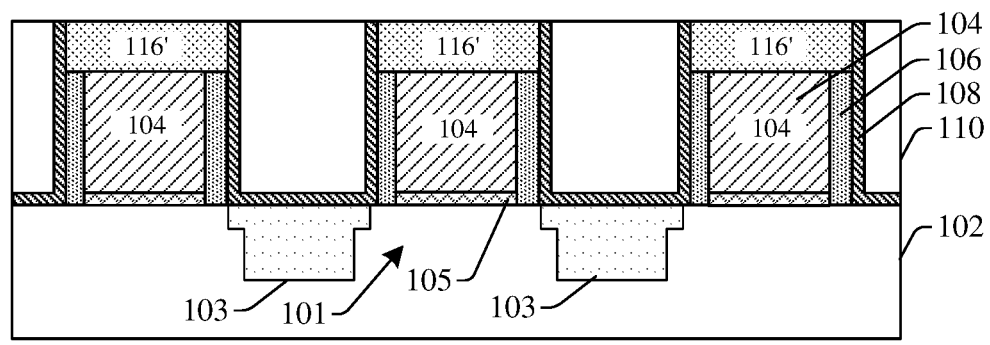

As shown in FIG. 7, in some embodiments, a gate capping precursor layer 116' is formed on the recessed gate electrode 104 and may function as a protection layer to protect the gate electrode 104 from subsequent processing steps. In some embodiments, the gate capping precursor layer 116' may be deposited and then planarized to be aligned or coplanar with top surfaces of the lower ILD layer 110 and/or the lower etch stop layer 108. The gate capping precursor layer 116' may comprise or be made of silicon or silicon nitride or metal oxide.

Figure 8:
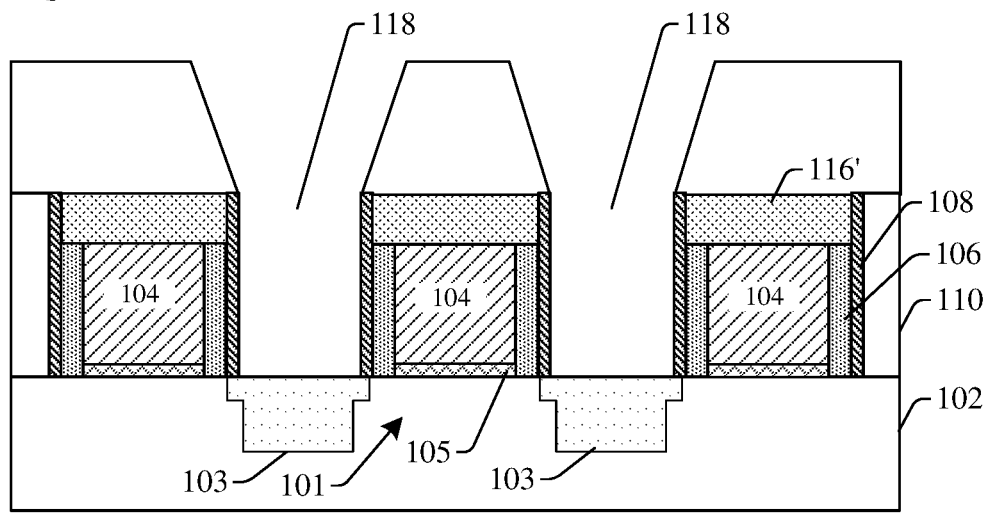

As shown in FIG. 8, an opening 118 is formed through the lower ILD layer 110 and the lower etch stop layer 108 under the lower ILD layer 110. In some cases, the opening 118 provides access to source/drain regions 103, and/or body contact regions. As an example, the opening 118 may be formed by a suitable combination of lithographic patterning and etching (e.g., wet or dry etching) processes.

Figure 9:
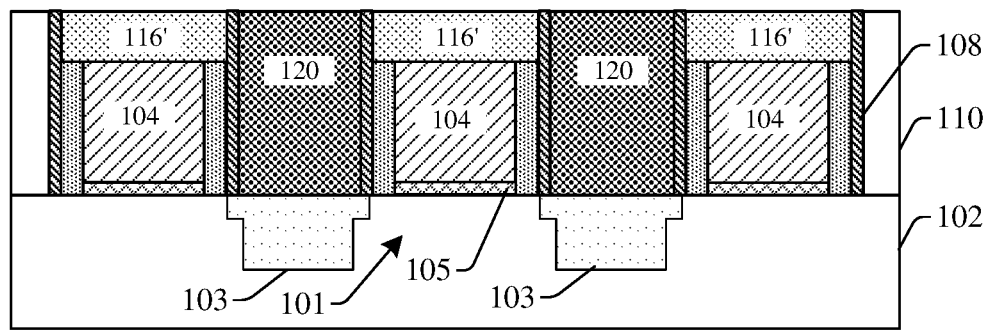

As shown in FIG. 9, in some embodiments, a lower source/drain contact 120 fills within the opening 118 and forms on the source/drain regions 103. In some embodiments, the lower source/drain contact 120 may be formed self-aligned by removing the lower ILD layer 110 completely, and thus the lower source/drain contact 120 may directly contact sidewalls of the lower etch stop layer 108. The gate capping precursor layer 116' covers and protects the gate electrode 104 during the formation of the opening 118 and the lower source/drain contact 120. In some examples, the lower source/drain contact 120 may include cobalt, or other appropriate material such as W, Cu, Ru, Al, Rh, Mo, Ta, Ti. The lower source/drain contact 120 may also include a glue or barrier layer that helps to bond and/or prevent diffusion. After the deposition of the lower source/drain contact 120, a chemical mechanical planarization (CMP) process may be performed to remove excess material of the lower source/drain contact 120 and planarize the top surface of the workpiece. A metallization process may be performed prior to forming the lower source/drain contact 120 to form a semiconductor-metal compound film (such as silicide, germanides, germanosilicide) at an interface of the lower source/drain contact 120 and the exposed portion of the upper surface of the source/drain regions 103 thus providing a low resistance contact.

Figure 10:
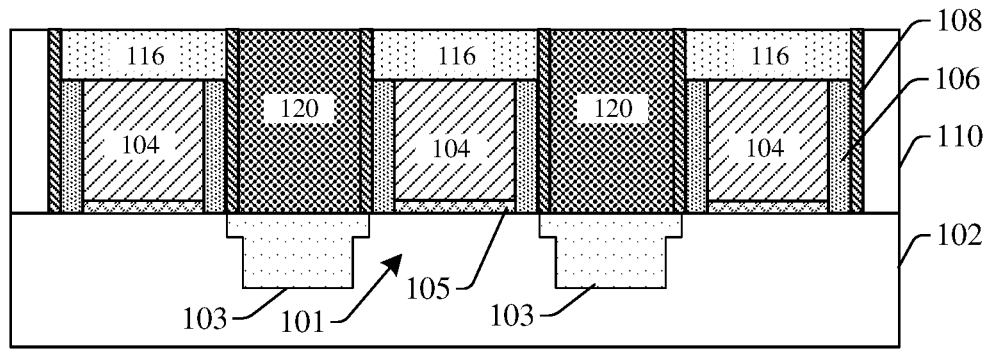

As shown in FIG. 10, in some embodiments, the gate capping precursor layer 116' is removed and replaced with a gate capping layer 116 with a smaller dielectric constant, thus reduce parasitic capacitance. The gate capping layer 116 may comprise silicon dioxide or low-κ dielectric material with a dielectric constant smaller than 3.9. For example, the gate capping layer 116 may comprise carbon doped oxide dielectrics comprised of Si, C, O, and H (SiCOH), Low hydrogen content silicon oxycarbonitride (SiOCN), silicon oxycarbide (SiOC), or other applicable low-κ dielectric material.

Figure 11:
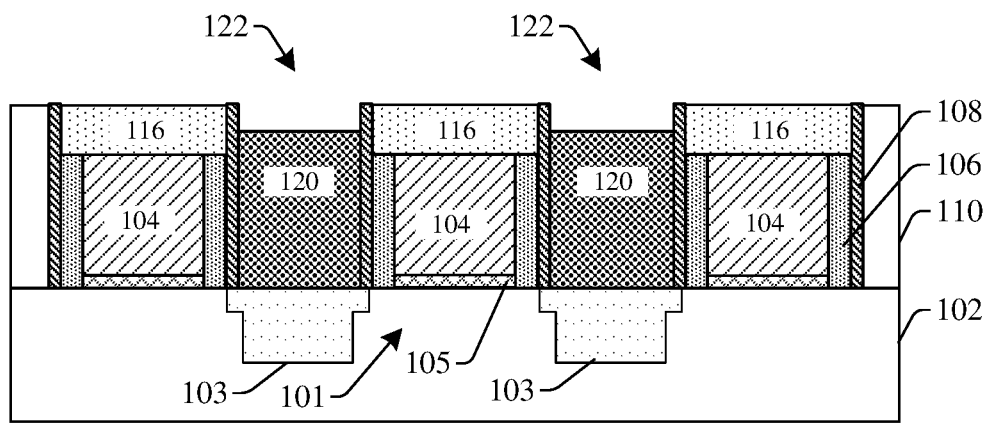

As shown in FIG. 11, in some embodiments, the lower source/drain contact 120 is recessed and thus an opening 122 is formed within an upper portion of the lower etch stop layer 108. An etching process is performed to the lower source/drain contact 120 to lower a top surface of the lower source/drain contact 120 to a position lower than a top surface of the lower etch stop layer 108. In some embodiments, the etching process comprises an anisotropic etch such as a vertical dry etch, and the recessed top surface of the lower source/drain contact 120 is substantially planar as shown in the figures. In some alternative embodiments, the etching process comprises an isotropic etch such as a wet etch, and the recessed top surface of the lower source/drain contact 120 can be a concave shape though not shown in the figures.

Figure 12:
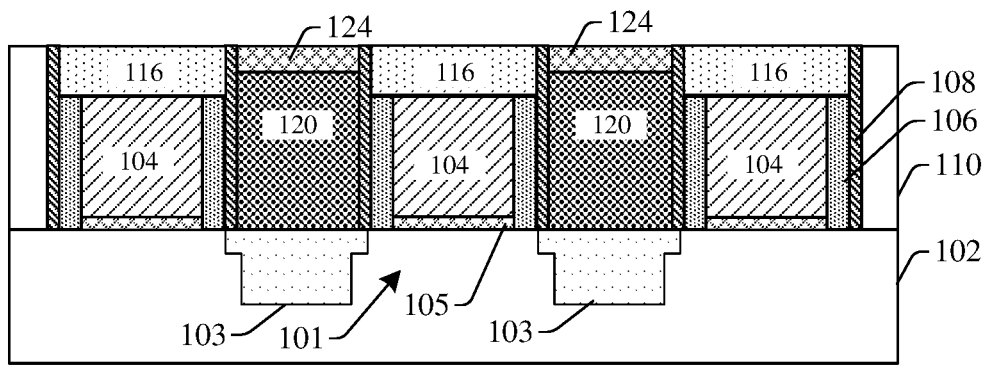

As shown in FIG. 12, a source/drain capping layer 124 is formed to fill the opening 122 within the upper portion of the lower source/drain contact 120. In some embodiments, the source/drain capping layer 124 may be formed by depositing a dielectric material followed by a CMP process. The source/drain capping layer 124 may have a top surface aligned or coplanar with that of the gate capping layer 116 and/or the lower etch stop layer 108. The source/drain capping layer 124 provides a protection and isolation to the lower source/drain contact 120.

Figure 13:
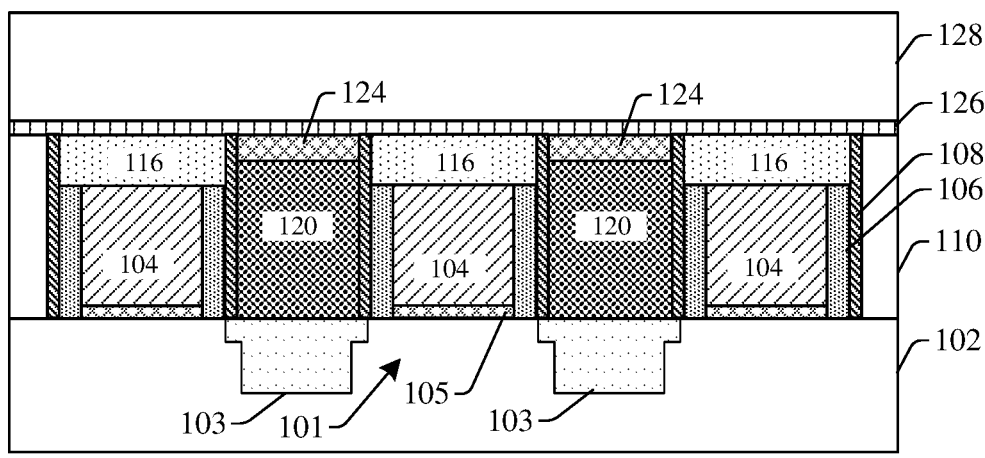

As shown in FIG. 13, an upper etch stop layer 126 is formed over the gate capping layer 116, and an upper ILD layer 128 is formed over the upper etch stop layer 126. As an example, the upper etch stop layer 126 may comprise or be made of aluminum oxide, silicon nitride or zirconia. Other applicable dielectric materials may also be used for the upper etch stop layer 126. In some embodiments, the upper ILD layer 128 may include materials such as tetraethylorthosilicate (TEOS) oxide, un-doped silicate glass, or doped silicon dioxide such as borophosphosilicate glass (BPSG), fused silica glass (FSG), phosphosilicate glass (PSG), boron doped silicon glass (BSG), and/or other suitable dielectric materials. Thus, in some cases, the upper ILD layer 128 may be substantially the same as the lower ILD layer 110. In various embodiments, the upper etch stop layer 126 and the upper ILD layer 128 may be deposited by a subatmospheric CVD (SACVD) process, a flowable CVD process, an ALD process, a PECVD process, or other suitable deposition technique. In some examples, the upper etch stop layer 126 has a thickness of about 5 nm to about 20 nm, and the upper ILD layer 128 has a thickness of about 20 nm to about 40 nm.

Figure 14:
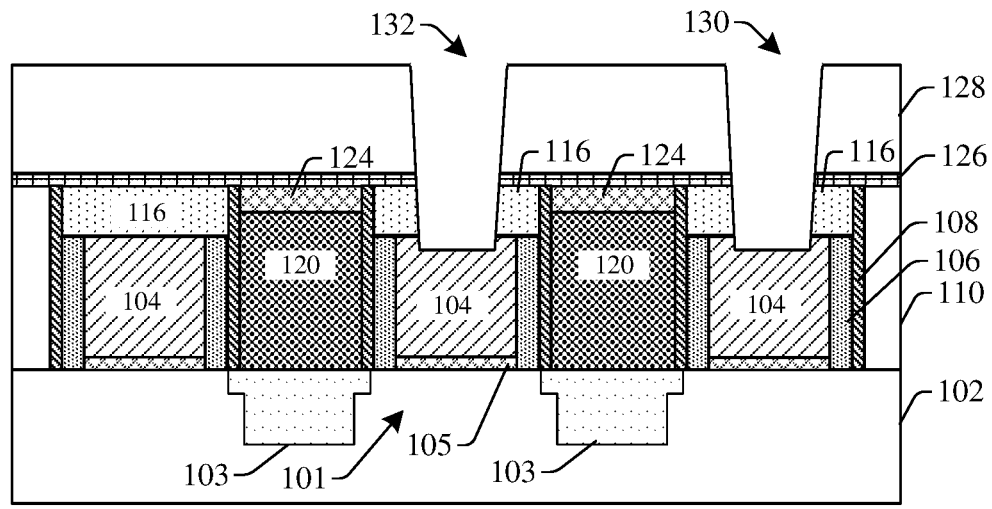
Figure 15:
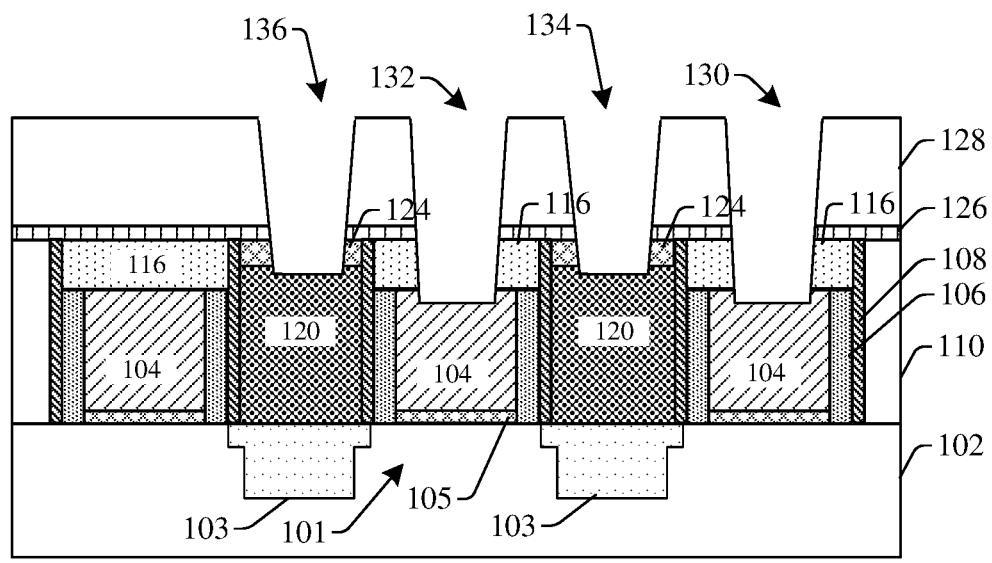
Figure 16:
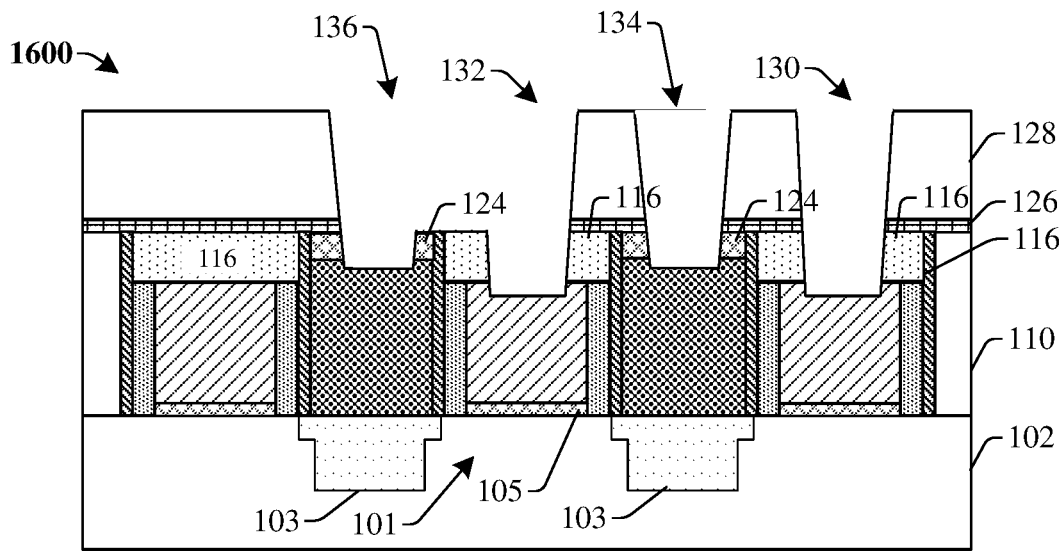

As shown in FIGS. 14-16, a plurality of openings 130, 132, 134, 136 is formed to reach on the gate capping layer 116 or the source/drain capping layer 124 and then filled with a core metal material. In some embodiments, the core metal material can be tungsten, cobalt, ruthenium, titanium nitride, tantalum nitride, or other applicable metal. The plurality of openings 130, 132, 134, 136 can be formed one by one in any order or in some combination manner, and the plurality of openings 130, 132, 134, 136 may be all formed prior to filling the core metal material concurrently. Heights of the recessed lower source/drain contact 120 and the recessed gate electrode 104 and the thicknesses of the gate capping layer 116 and the source/drain capping layer 124 may vary based on subsequent manufacturing steps. For example, the lower source/drain contact 120 may be recessed less than the gate electrode 104 as shown in the figures, and the source/drain capping layer 124 is formed thinner than the gate capping layer 116, such that the gate electrode 104 can be better protected when forming the openings 134, 136 through the source/drain capping layer 124. Alternatively, the lower source/drain contact 120 may be recessed more and lower than the gate electrode 104 though not shown in the figures if the openings 134, 136 are formed first, such that subsequently the source/drain regions 103 can be better protected when forming the openings 130, 132 through the gate capping layer 116. The openings 130, 132, 134, 136 may respectively be formed by a multiple-step etching process separately to improve etch selectivity and provide over-etch control.

For example, referring to FIG. 14, the openings 130, 132 may be formed as a first pattern by performing a first etch having a high etching rate to the upper ILD layer 128 and stopping on the upper etch stop layer 126. Then, a second etch is performed to etch the upper etch stop layer 126 and the gate capping layer 116 slowly and thus expose the gate electrode 104 with proper over etching. Alternatively, the opening 130 may be formed by performing a first etch having a high etching rate to the upper ILD layer 128 and the upper etch stop layer 126 and stopping on the gate capping layer 116. Then, a second etch is performed to etch through the gate capping layer 116 and thus expose the gate electrode 104. The openings 130, 132 may also be formed by a suitable combination of lithographic patterning and etching (e.g., wet or dry etching) processes.

Similarly, referring to FIG. 15, the openings 134, 136 may be formed as a second pattern by performing a first etch having a high etching rate to the upper ILD layer 128 and stopping on the upper etch stop layer 126. Then, a second etch is performed to etch the upper etch stop layer 126 and the source/drain capping layer 124 slowly and thus expose the lower source/drain contact 120 with proper over etching. The openings 134, 136 may also be formed by a suitable combination of lithographic patterning and etching (e.g., wet or dry etching) processes.

As shown in FIG. 16, a third pattern is formed by merging the openings 132 and 136 by etching through the upper ILD layer 128 and the upper etch stop layer 126 therebetween. In some embodiments, the patterning process (e.g., for the formation of the plurality of openings) may include a multiple-step etching process to etch the upper ILD layer 128 and the upper etch stop layer 126 separately to improve etch selectivity and provide over-etch control.

Figure 17:
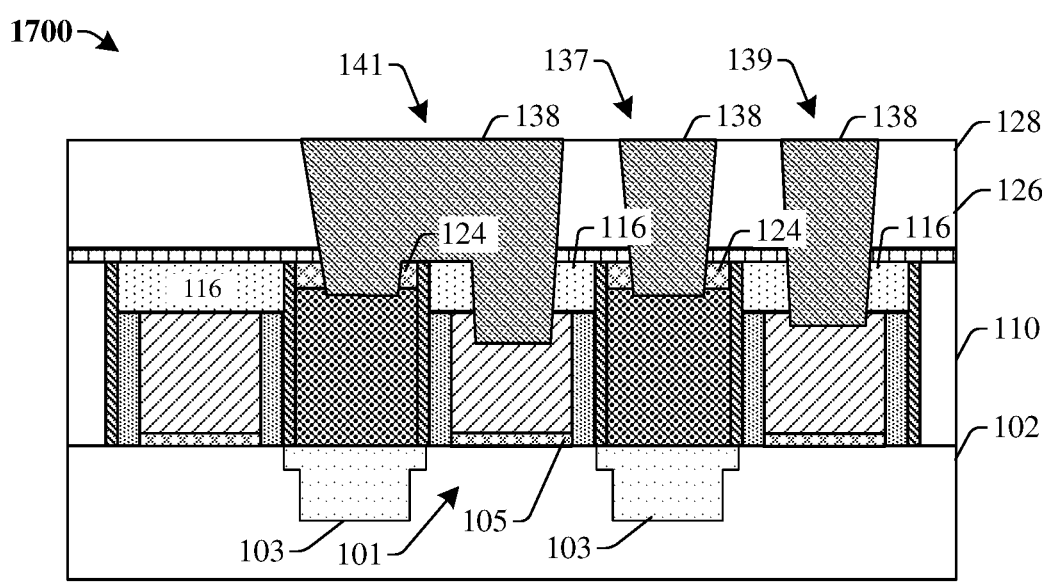

As shown in FIG. 17, one or more metal layers are formed in the openings 130, 132, 134, 136. In some cases, the body contact 141 provides for a direct contact between the gate electrode 104 and an adjacent source, drain, and/or body region. The upper source/drain contact 137 provides an access to the source/drain regions within the substrate 102 through the lower source/drain contact 120, and the gate electrode contact 139 provides access to the gate electrode 104. As discussed above, the source/drain capping layer 124 isolates and protects the lower source/drain contact 120. The gate capping layer 116 isolates and protects the gate electrode 104. By arranging the gate capping layer 116, the upper etch stop layer 126, the source/drain capping layer 124 on the lower source/drain contact 120, and the gate capping layer 116 on the gate electrode 104 as disclosed, the formation process of the upper source/drain contact 137 can be integrated together with forming the gate electrode contact 139 and the body contact 141. In some embodiments, the formation of the metal layers comprises forming a metal core 138 and a barrier layer not shown in the figures by deposition processes.

Figure 18:
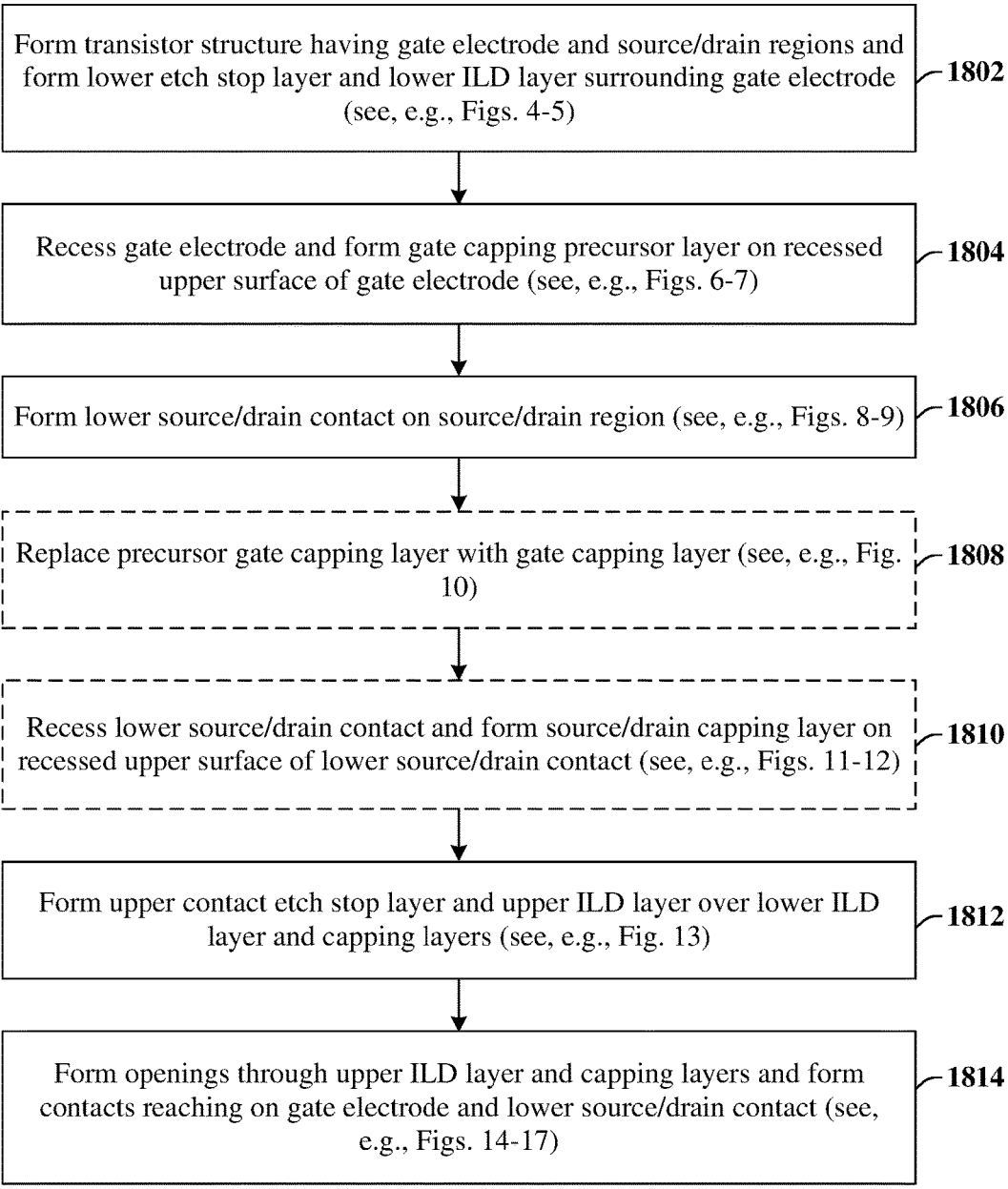
FIG. 18 illustrates a flow diagram of some embodiments of a method of forming an integrated circuit having a contact capping layer.

FIG. 18 illustrates a flow diagram of some embodiments of a method 1800 of forming an integrated chip having an interconnect structure with an intermixing barrier layer.

While method 1800 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1802, a transistor structure is formed and surrounded by a lower ILD layer. The transistor structure comprises a gate electrode formed over a substrate and a pair of source/drain regions disposed on opposite sides of the gate electrode. A sidewall spacer is formed alongside the gate electrode lining or covering sidewalls of the gate electrode. In some embodiments, a first etch stop layer is formed lining an upper surface of the source/drain regions and extending along the gate electrode. The gate electrode may be formed by a replacement gate process that removes a gate precursor and replaces with a high-κ dielectric material and a metal gate material. FIGS. 4-5 illustrate cross-sectional views 400-500 of some embodiments corresponding to act 1802.

At 1804, in some embodiments, the gate electrode is recessed, and a gate capping precursor layer is formed on the recessed upper surface of the gate electrode. In some embodiments, the gate capping precursor layer comprises or is made of silicon, silicon nitride, or metal oxide. FIGS. 6-7 illustrate cross-sectional views 600-700 of some embodiments corresponding to act 1804.

At 1806, a lower source/drain contact is formed reaching on a source/drain region of the transistor structure within the substrate. In some embodiments, an opening is formed by partially or completely removing the lower ILD layer with the gate capping precursor layer in place. A conductive material is then filled in the opening as the lower source/drain contact. The gate capping precursor layer protects underlying gate electrode from being exposed during the formation of the lower source/drain contact. FIGS. 8-9 illustrate cross-sectional views 900-1000 of some embodiments corresponding to act 1806.

At 1808, in some embodiments, the gate capping precursor layer is replaced by a gate capping layer with a smaller dielectric constant. In some embodiments, the gate capping layer comprises or is made of silicon dioxide or a low-κ dielectric material with a dielectric constant smaller than 3.9. Thus, a parasitic capacitance related to the gate capping layer is reduced, and device performance can be thereby improved. FIG. 10 illustrates a cross-sectional view 1000 of some embodiments corresponding to act 1808.

At 1810, in some embodiments, the lower source/drain contact may be recessed and a source/drain capping layer may be formed on the lower source/drain contact to fill an opening within an upper portion of the lower etch stop layer. In some embodiments, the source/drain capping layer may be formed by depositing a dielectric material followed by a CMP process. FIGS. 11-12 illustrate cross-sectional views 1100-1200 of some embodiments corresponding to act 1810.

At 1812, an upper ILD layer is formed over the gate capping layer and the source/drain capping layer. An upper etch stop layer may be formed prior to the formation of the upper ILD layer. FIG. 13 illustrates a cross-sectional view 1300 of some embodiments corresponding to act 1812.

At 1814, a plurality of openings is formed through the upper ILD layer and the upper etch stop layer and further through the gate capping layer and the source/drain capping layer to expose the gate electrode and the lower source/drain contact. The plurality of openings is then filled with a metal material to form a plurality of contacts for gate electrode, source/drain regions, body contact regions, and/or other device features. In some embodiments, the metal material comprises tungsten, cobalt, ruthenium, titanium nitride, tantalum nitride, or other applicable metal. FIGS. 14-17 illustrate cross-sectional views 1400-1700 of some embodiments corresponding to act 1814.

Therefore, the present disclosure relates to a new integrated circuit device that comprises a gate capping layer on a recessed gate electrode, a source/drain capping layer on a recessed source/drain contact, or the both, to protect and prevent current leakage. The gate capping layer and/or the source/drain capping layer may comprise dielectric materials with relative small dielectric constant (e.g. low-κ dielectric material with a dielectric constant smaller than 3.9) such that parasitic capacitance can be minimized.

Accordingly, in some embodiments, the present disclosure relates to an integrated circuit device. A transistor structure is disposed over a substrate and includes a pair of source/drain regions and a gate electrode between the pair of source/drain regions. A lower inter-layer dielectric (ILD) layer is disposed over the pair of source/drain regions and surrounds the gate electrode. The gate electrode is recessed from top of the lower ILD layer. A gate capping layer is disposed on the gate electrode. The gate capping layer has a top surface aligned or coplanar with that of the lower ILD layer.

In other embodiments, the present disclosure relates to an integrated circuit device. A transistor structure is disposed over a substrate and includes a pair of source/drain regions and a gate electrode between the pair of source/drain regions. A gate capping layer is disposed on the gate electrode. A lower etch stop layer lines sidewalls of the gate electrode and the gate capping layer. A lower source/drain contact is disposed on one side of the lower etch stop layer opposite to the gate electrode and reaches on a first source/drain region of the pair of source/drain regions.

In yet other embodiments, the present disclosure relates to a method of forming an integrated circuit device. The method comprises forming a transistor structure disposed over a substrate and including a pair of source/drain regions and a gate electrode between the pair of source/drain regions and forming a lower etch stop layer and a lower inter-layer dielectric (ILD) layer over the pair of source/drain regions surrounding the gate electrode. The method further comprises recessing the gate electrode and forming a gate capping precursor layer on the recessed gate electrode and forming a lower source/drain contact on a source/drain region of the pair of source/drain regions. The method further comprises replacing the gate capping precursor layer with a gate capping layer, the gate capping layer having a dielectric constant smaller than that of the gate capping precursor layer and forming an upper ILD layer over the lower ILD layer and the gate capping layer. The method further comprises forming a gate contact through the upper ILD layer and the gate capping layer reaching on the gate electrode The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device, comprising:
    a transistor structure disposed over a substrate and including a pair of source/drain regions and a gate electrode between the pair of source/drain regions;
    a lower inter-layer dielectric (ILD) layer disposed over the pair of source/drain regions and surrounding the gate electrode, the gate electrode recessed from top of the lower ILD layer;
    a gate capping layer disposed on the gate electrode, wherein the gate capping layer comprises a low-K dielectric material;
    a first source/drain contact disposed on a source/drain region of the pair of source/drain regions; and
    a contact structure comprising a first portion and a second portion, wherein the first portion is disposed through the gate capping layer, and wherein the second portion directly contacts the first source/drain contact,
    wherein the gate capping layer has a top surface aligned with that of the lower ILD layer.

2. The integrated circuit device of claim 1, wherein the gate capping layer comprises carbon doped oxide dielectrics comprised of Si, C, O, and H (SiCOH), Low hydrogen content silicon oxycarbonitride (SiOCN), silicon oxycarbide (SiOC).

3. The integrated circuit device of claim 1, further comprising:
    an upper ILD layer disposed over the gate capping layer and the lower ILD layer; and
    a gate electrode contact disposed through the upper ILD layer and the gate capping layer and reaching on the gate electrode.

4. The integrated circuit device of claim 3, further comprising:
    a source/drain capping layer disposed on the first source/drain contact; and
    a second source/drain contact disposed through the upper ILD layer and the source/drain capping layer reaching on the first source/drain contact.

5. The integrated circuit device of claim 4, wherein the source/drain capping layer comprises silicon carbide or silicon nitride.

6. The integrated circuit device of claim 4, wherein the gate capping layer and the source/drain capping layer have top surfaces aligned with one another.

7. The integrated circuit device of claim 4, further comprising:
    a lower etch stop layer lining sidewalls of the lower ILD layer;
    wherein the lower etch stop layer contacts sidewalls of the first source/drain contact and the source/drain capping layer.

8. The integrated circuit device of claim 7, wherein the lower etch stop layer has a top surface aligned with that of the gate capping layer and the source/drain capping layer.

9. The integrated circuit device of claim 4, further comprising:
    an upper etch stop layer disposed between the upper ILD layer and the lower ILD layer;
    wherein a bottom surface of the upper etch stop layer contacts the gate capping layer and the source/drain capping layer.

10. The integrated circuit device of claim 3, wherein the first portion and the second portion are disposed through the upper ILD layer.

11. An integrated circuit device, comprising:
a transistor structure disposed over a substrate and including a pair of source/drain regions and a gate electrode between the pair of source/drain regions;
a gate capping layer disposed on the gate electrode;
a lower etch stop layer lining a sidewall of the gate electrode and lining and contacting a sidewall of the gate capping layer; and
a lower source/drain contact disposed on one side of the lower etch stop layer opposite to the gate electrode and reaching on a source/drain region of the pair of source/drain regions; and
a gate electrode contact disposed through the gate capping layer and reaching on the gate electrode,
wherein the gate electrode contact is separated from the lower source/drain contact by the gate capping layer,
wherein the gate capping layer is a seamless piece comprising an inner portion with a first thickness and a peripheral portion with a second thickness smaller than the first thickness.

12. The integrated circuit device of claim 11, further comprising a source/drain capping layer disposed on the lower source/drain contact.

13. The integrated circuit device of claim 12, further comprising an upper ILD layer disposed over the gate capping layer, the lower etch stop layer, and the source/drain capping layer.

14. The integrated circuit device of claim 13, further comprising an upper source/drain contact disposed through the upper ILD layer and the source/drain capping layer and reaching on the lower source/drain contact, wherein the upper source/drain contact is separated from the gate electrode by the source/drain capping layer.

15. The integrated circuit device of claim 13, wherein the gate electrode extends upwardly through the upper ILD layer.

16. The integrated circuit device of claim 13, further comprising:
a contact structure comprising a first portion and a second portion, wherein the first portion is disposed through the upper ILD layer and the gate capping layer, and wherein the second portion is disposed through the upper ILD layer and the source/drain capping layer.

17. The integrated circuit device of claim 11, further comprising a sidewall spacer disposed between the gate electrode and the lower etch stop layer, the sidewall spacer having a top surface contacting a lower surface of the gate capping layer and an upper sidewall contacting a lower sidewall of the gate capping layer.

18. The integrated circuit device of claim 17, further comprising an upper etch stop layer disposed on the gate capping layer and the lower etch stop layer.

19. An integrated circuit device, comprising:
a transistor structure disposed over a substrate and including a pair of source/drain regions and a gate electrode between the pair of source/drain regions;
a sidewall spacer disposed along the gate electrode;
a lower inter-layer dielectric (ILD) layer disposed over the pair of source/drain regions surrounding the gate electrode;
a gate capping layer on upper surfaces of the gate electrode and the sidewall spacer, the gate capping layer comprising a low-K dielectric material;
a lower etch stop layer disposed along and contacting sidewalls of the sidewall spacer and the gate capping layer;
an upper ILD layer disposed over the lower ILD layer and the gate capping layer; and
a gate contact through the upper ILD layer and the gate capping layer reaching on the gate electrode.

20. The integrated circuit device of claim 19, further comprising:
a lower source/drain contact disposed on a source/drain region of the pair of source/drain regions;
a source/drain capping layer disposed on the lower source/drain contact; and
an upper source/drain contact disposed through the upper ILD layer and the source/drain capping layer reaching on the lower source/drain contact,
wherein the upper source/drain contact is separated from the gate electrode by the source/drain capping layer, and
wherein the lower etch stop layer is disposed along sidewalls of the lower source/drain contact and the source/drain capping layer.

* * * * *